United States Patent
Krishaswamy et al.

[11] Patent Number: 5,853,601
[45] Date of Patent: Dec. 29, 1998

[54] TOP-VIA ETCH TECHNIQUE FOR FORMING DIELECTRIC MEMBRANES

[75] Inventors: Silaipillayarputhur V. Krishaswamy, Monroeville; William F. Valek, McDonald; Thomas M. Valko, West Mifflin, all of Pa.; Curtis E. Milton, Jr., Glen Burnie; Joel F. Rosenbaum, Seabrook, both of Md.

[73] Assignee: Northrop Grumman Corporation, Los Angeles, Calif.

[21] Appl. No.: 832,080

[22] Filed: Apr. 3, 1997

[51] Int. Cl.[6] .................. H01L 21/00; B44C 1/22
[52] U.S. Cl. ................ 216/2; 216/41; 216/56; 438/735
[58] Field of Search .................... 216/2, 41, 56, 216/79, 99; 438/719, 723, 733, 739, 743, 753, 735

[56] References Cited

U.S. PATENT DOCUMENTS

| | | |
|---|---|---|
| 4,849,071 | 7/1989 | Evans et al. ............... 216/2 X |
| 4,893,509 | 1/1990 | MacIver et al. ............ 216/2 X |
| 5,185,589 | 2/1993 | Krishnaswamy et al. . |
| 5,233,259 | 8/1993 | Krishnaswamy et al. . |
| 5,445,991 | 8/1995 | Lee ............................. 216/2 |
| 5,496,436 | 3/1996 | Bernstein et al. ........... 216/2 |

*Primary Examiner*—William Powell
*Attorney, Agent, or Firm*—Walter G. Sutcliff

[57] ABSTRACT

A top-via etch technique for forming dielectric membranes for thin film devices, the dielectric membrane being deposited on the upper planar surface of the substrate. After the thin film device is formed on the dielectric membrane, a photoresist etch mask is deposited on the entire upper planar surface of the substrate, including the thin film structure. Vias are formed through the dielectric membrane and the protective photoresist etch mask to expose the upper planar surface of the substrate along opposite first and second ends of the thin film device. The upper planar surface of the substrate is isotropically etched using a reactive ion etching technique for example, to form air gaps beneath the dielectric membrane. The etching process may be carried out in etch segments of predetermined intervals, each followed by a cool down period of a prescribed interval.

21 Claims, 6 Drawing Sheets

FIG.6 ially available tuning elements. Film bulk acoustic resonators (FBARs) provide a unique means by which monolithic RF filters may be made as having smaller, reduced weight, microwave and millimeter wave front-ends.

TOP-VIA ETCH TECHNIQUE FOR FORMING DIELECTRIC MEMBRANES

BACKGROUND OF THE INVENTION

1. Field of the Invention

The present invention relates to a top-via etch technique for forming dielectric membranes. More particularly, the present invention is related to a top-via etch technique for forming dielectric membranes for thin film devices such as film bulk acoustic resonators and filters.

2. Description of the Background Art

The dense signal spectrum that encompasses both electronic battlefield and urban areas provides a hostile signal environment in which capable communications filters are essential for ensuring usefulness of radio frequency (RF) devices. Filters currently dominate the size of RF products for both military and commercial applications. For example, Table 1 shows the per unit volume occupied by filters in various receiver modules.

Large scale integration of RF circuitry, which is necessary to achieve maximum performance within the volume and weight restrictions of modern active aperture antennas, missiles, precision-guided missiles/munitions and electronic warfare systems, has been hampered by the lack of high-Q tuning elements. The continuing development of semiconductor integrated circuits since 1960, through large scale integration (LSI) and very large scale integration (VLSI) has resulted in active semiconductor devices nearly three orders of magnitude smaller in volume than the smallest commercially available tuning elements. Film bulk acoustic resonators (FBARs) provide a unique means by which monolithic RF filters may be made as having smaller, reduced weight, microwave and millimeter wave front-ends.

TABLE 1

Typical Filter Content of Various RF Subsystem Components

| Subsystem | Filter Requirements | Frequency Bands | Volume |
|---|---|---|---|
| Front-end Channelizers | High Rejection, Low Loss | X or Ku | 80% |
| Frequency Converters | Moderate Rejection, Moderate Loss | VHF through MMW | 60% |
| Direct Synthesizers | High Rejection, Moderate Loss | 0.4 to 18 GHz | 75% |
| Channelized Receivers | High Rejection, Moderate Loss | 0.6 to 4 GHz | 70% |

FBAR filters are the smallest, low loss microwave filters available and are the most significant advance in microwave monolithic integrated circuits (MMIC) technology after solid-state active devices. These filters are expected to be g-insensitive. Typically, a resonator occupies an area of 0.04 $mm^2$ and has a reasonably high Q (about 1000 to 2000). The Q per unit volume is about $10^{15}$ per cubic meter, which is about $10^7$ higher than cavities and $10^4$ higher than L–C lumped elements. These filters can handle high drive power. It has been demonstrated that zinc oxide (ZnO) FBAR filters have power handling capabilities of up to 2W. Since FBARs are fabricated using thin films on semiconductor substrates, FBARs are capable of being integrated with other active MMIC circuit elements.

Film bulk acoustic resonators (FBAR) are composite structures consisting of an electrically excited, thin piezoelectric film supported on a dielectric membrane. Typically, the piezoelectric film may be aluminum nitride (AlN) or zinc oxide (ZnO) and the dielectric membrane may be silicon dioxide ($SiO_2$). The dielectric membrane is typically formed by backside anisotropic etching using chemical or reactive ion etching (RIE) of a silicon (Si) or gallium arsenide (GaAs) semiconductor substrate.

Figure 1:
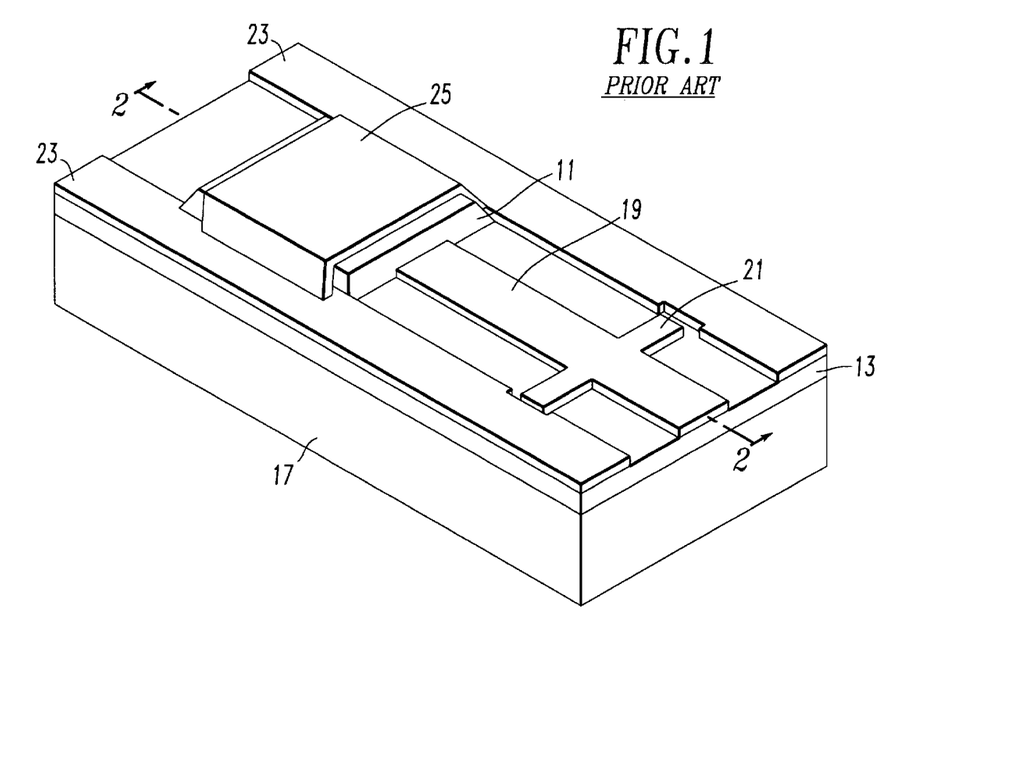
FIG. 1 is a perspective view of a conventional FBAR device.
Figure 2:
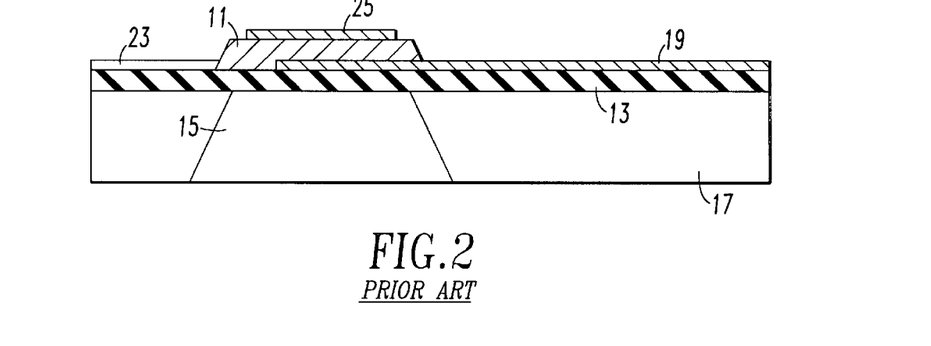
FIG. 2 is a cross-sectional view of the FBAR device illustrated in FIG. 1 taken along line 2—2.

A typical FBAR structure as illustrated in FIGS. 1 and 2 includes a mesa-shaped piezoelectric layer 11 disposed on a dielectric membrane (insulating layer) 13, which spans air gap 15 formed within substrate 17. An input electrode 19 formed on dielectric membrane 13 is configured as a transmission line in this particular example, and has one end positioned above air gap 15, as can be understood in view of FIG. 2. Transmission line 19 extends to connect with associated circuitry such as shunt inductor 21. A ground plane 23 is formed on the dielectric membrane 13 adjacent to the FBAR and coplanar with the input transmission line 19. Ground plane 23 has one portion extending over the piezoelectric layer 11 to form an output electrode 25. In this particular exemplary configuration, the FBAR will function as a shunt element providing a band stop device.

Figure 3A:
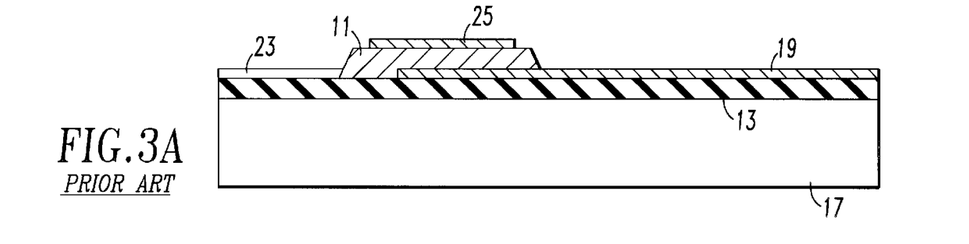
FIGS. 3A–3D illustrate cross-sectional structural views exemplary of processing steps of a conventional back-side via etching process.

The manner in which air gap 15 is formed below dielectric membrane 13 along the underside portion of the conventional FBAR as illustrated in FIGS. 1 and 2 will now be described with respect to FIGS. 3A–3D. FIG. 3A illustrates in cross-sectional view the FBAR of FIG. 1, subsequent a first processing step, as including dielectric membrane 13 deposited upon an upper planar surface of substrate 17. As illustrated, the mesa-shaped piezoelectric layer 11 is deposited upon dielectric membrane 13 and a portion of input electrode 19. Output electrode 25 is illustrated as deposited upon piezoelectric layer 11 and ground plane 23 is illustrated as deposited upon dielectric membrane 13. The FBAR as illustrated in the cross-sectional view of FIG. 3A is manufactured using typical processing techniques as would be readily understood by one of ordinary skill.

Figure 3B:
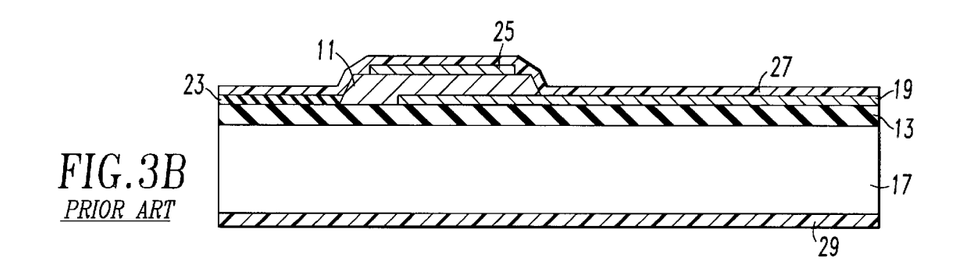

Upon completion of these processing steps, protective layers 27 and 29 are respectively deposited upon an upper planar surface of the processed structure and a lower planar surface of substrate 17, as illustrated in the FIG. 3B cross-sectional view of the FBAR. Protective layers 27 and 29 may typically comprise $SiO_2$.

Figure 3C:
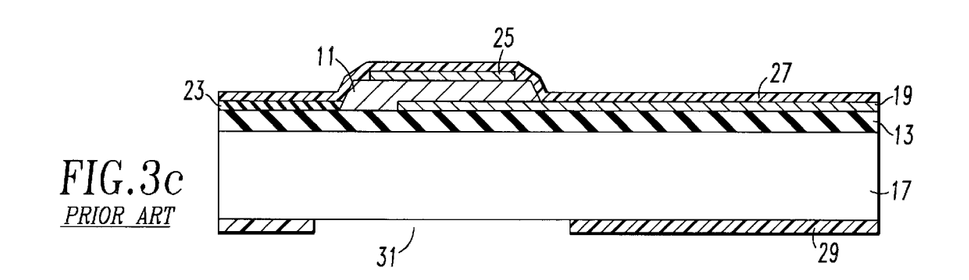
Figure 3D:
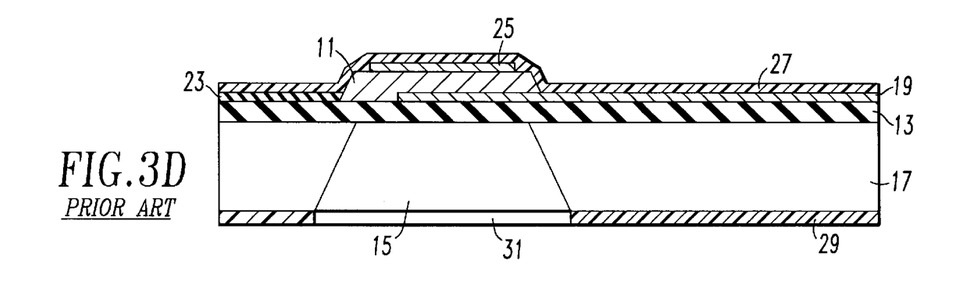

Thereafter, as illustrated in the FIG. 3C cross-sectional view of the FBAR, a window 31 is formed through protective layer 29 to expose the backside of substrate 17 beneath the FBAR. Thereafter, air gap 15 is formed by anisotropic etching of substrate 17 from the backside through window 31. Ideally, etching of substrate 17 is complete so that air gap 15 is bounded by dielectric membrane 13, as illustrated in the FIG. 3D cross-sectional view of the FBAR. The anisotropic etch may typically be chemical or RIE etching. Potassium hydroxide (KOH) or ethylene diamine pyrocatechol and water (EDPW) solutions may be used for chemical etching. Typically, the RIE etching may comprise a dry etch process employing sulfur fluoride ($SF_6$) gas. In both the chemical and RIE etching, some etch-stop layer is used to precisely terminate the etch operation. Upon completion of the etching process, protective layers 27 and 29 are removed such that the structure as illustrated in FIG. 2 is obtained.

Although back via etching techniques may be successfully used to form dielectric membranes for supporting piezoelectric films in connection with fabrication of acoustic resonators and filters, the etching must be highly anisotropic in order to obtain a membrane lateral size less than the thickness of the wafer. Moreover, since no suitable protective layer is available, chemical etching is not desirable for processing vias after critical top-side piezoelectric thin films and metallization have been formed. Also, the back via etch processing technique requires back-to-front infrared (IR) alignment to align the windows or via holes along the backside of the substrate to the FBAR region. This requires the wafer to be double-side polished, thus increasing the cost of the device and the alignment process. Furthermore, since backside alignment and backside wet or dry etching is required, the process is not particularly compatible with integrated circuit (IC) processing. Also, since backside etching is used, the etching must be done to a depth equivalent to the thickness of the substrate or wafer, which is usually approximately 500 microns. Reproducibility of a high degree of anisotropy at this depth is extremely difficult to obtain. An etch time of several hours is required. This further introduces difficulty with respect to protecting the top side during the long etch process and may contribute to dielectric membrane rupture, and thus device degradation or failure.

Figure 4A:
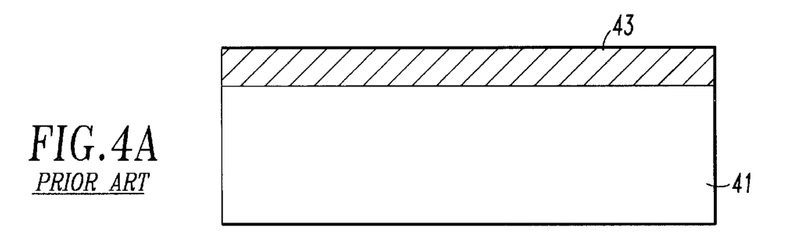
FIGS. 4A–4D illustrate cross-sectional structural views exemplary of a conventional top-side etch process which includes removal of a sacrificial layer.
Figure 4B:
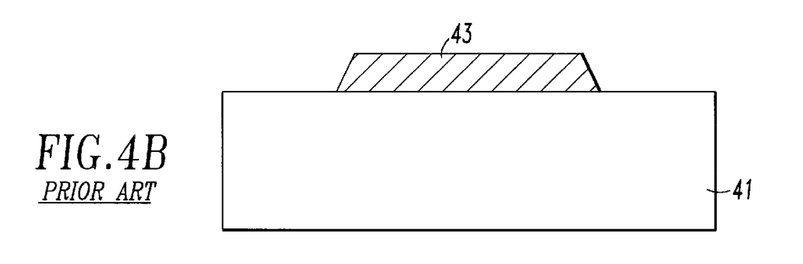
Figure 4C:
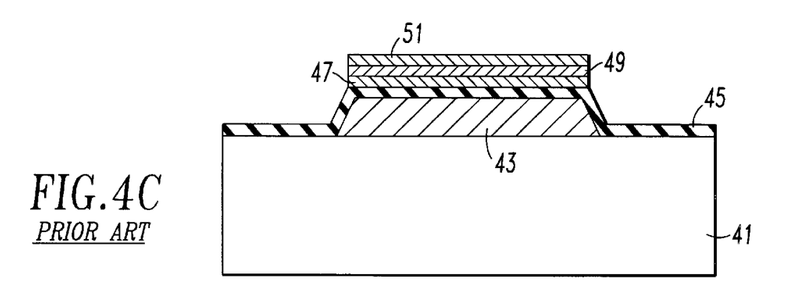
Figure 4D:
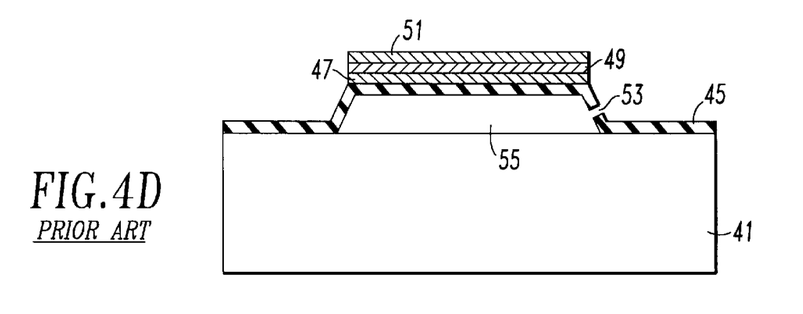

In addition to the conventional back via etching as described, an air gap may be formed beneath a dielectric membrane of an FBAR using a conventional top side etching technique, as will be described with respect to FIGS. 4A–4D. As illustrated in FIG. 4A in cross-section, sacrificial layer 43 of relatively poor quality ZnO is deposited upon the entire upper planar surface of substrate 41. Typically, substrate 41 may be silicon. As illustrated in FIG. 4B, sacrificial layer 43 is selectively removed using conventional techniques such that only a mesa-shaped portion of sacrificial layer 43 remains on the upper planar surface of substrate 41. Subsequently, as illustrated in FIG. 4C, dielectric membrane 45 is deposited upon the entire upper planar surface of substrate 41 including mesa-shaped portion 43 of the sacrificial layer. The FBAR is manufactured onto dielectric membrane 45 above the mesa-shaped portion 43 of the sacrificial layer. Lower input electrode 47, piezoelectric layer 49 and upper output electrode 51 are sequentially deposited upon dielectric membrane 45 above the mesa-shaped portion 43 of the sacrificial layer using typical known processing techniques to form the FBAR. Subsequently, a small channel 53 is formed through dielectric membrane 45 along a side edge of mesa-shaped portion 43 of the sacrificial layer. The sacrificial layer is subsequently chemically or wet etched through small channel 53 to form air gap 55, as illustrated in FIG. 4D.

Removal of sacrificial layer 43 through small channel 53 is however extremely difficult, negatively impacting reproducibility. Extreme care is required to protect the top piezoelectric/FBAR device during chemical etching. Moreover, the wet chemical etchant must be carefully and completely removed from the air gap to ensure stability of the FBAR. Moreover, it is difficult to grow a thick dielectric membrane of greater than 1 micron over the sacrificial layer.

SUMMARY OF THE INVENTION

Accordingly, there is a need for an improved dielectric membrane forming technique, usable in connection with thin film device and/or FBAR processing, which can be accurately controlled, which is highly uniform, which is complementary to other IC processing and which provides high device yield. A primary object of the present invention is to therefore provide a top-via etch technique for forming dielectric membranes for thin film devices. More particularly, a primary object of the present invention is to provide a top-via etch technique for forming dielectric membranes for FBARs or filters.

These and other objects of the present invention are fulfilled by providing a method of forming air gaps under a dielectric membrane, the dielectric membrane being deposited on an upper planar surface of a substrate and having a thin film device integrated thereon, the method including the steps of depositing a photoresist layer on the dielectric membrane and the thin film device;

forming respective first and second vias through the dielectric membrane and the photoresist layer at respective first and second ends of the thin film device to expose the substrate;

isotropically etching the substrate through the first and second vias to form air gaps under the dielectric membrane along the first and second ends of the thin film device; and removing the photoresist layer.

The objects of the present invention may also be fulfilled by providing a method of fabricating a film bulk acoustic resonator including the steps of depositing a membrane layer on an upper planar surface of a substrate;

forming a film bulk acoustic resonator on the membrane layer;

depositing a photoresist etch mask on the membrane layer and the film bulk acoustic resonator;

opening respective first and second vias through the membrane layer and the photoresist etch mask at respective first and second ends of the film bulk acoustic resonator to expose the substrate;

isotropically etching the substrate through the first and second vias to form air gaps under the membrane layer along the first and second ends of the film bulk acoustic resonator; and removing the photoresist etch mask.

The top-via etch technique for forming dielectric membranes of a preferred embodiment of the present application does not require removal of a sacrificial layer after device fabrication as is the case with conventional top side etching techniques described previously with respect to FIGS. 4A–4D. The dielectric membrane layer of the preferred embodiments acts an etch stop. The photoresist layer functions as an RIE etch mask and protects the device or resonator region. The top-via etch technique of the preferred embodiments results in improved uniformity since in the positioning of the vias, the etch process can be more accurately controlled.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DETAILED DESCRIPTION OF THE PREFERRED EMBODIMENT

FIGS. 5A–5G illustrate cross-sectional structural views exemplary of processing steps of a top-via etch technique for forming dielectric membranes for thin film devices such as acoustic resonators or filters in accordance with a preferred embodiment of the present application. FIG. 6 illustrates a top view of the device of FIG. 5G. It is to be understood that FIGS. 5A–5G and 6 are exemplary embodiments which are given by way of illustration only and are not deemed to be limiting. The various processing steps described with respect to FIGS. 5A–5G and 6 are not to be considered limiting and equivalent processing techniques for each of the particular processing steps may be used as would be understood by one of ordinary skill. Also, it is to be understood that the cross-sectional views are not particularly illustrated to scale and that shapes of the various features are exaggerated for the purpose of furthering understanding of the preferred embodiment.

Figure 5A:
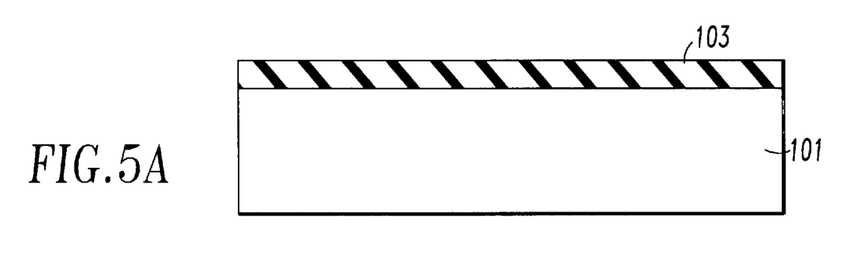
FIGS. 5A–5G illustrate cross-sectional structural views exemplary of a top-via etch process of a preferred embodiment of the present invention.
Figure 5B:
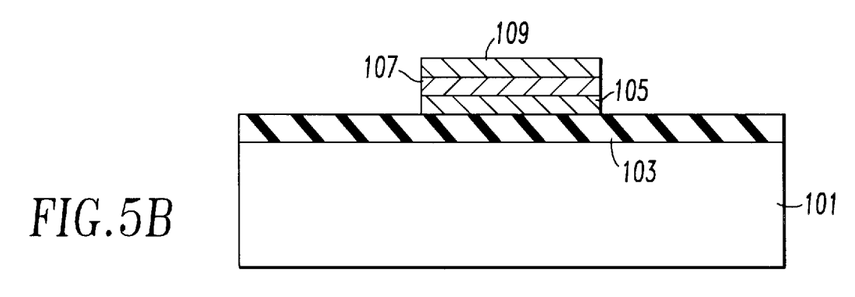
Figure 5C:
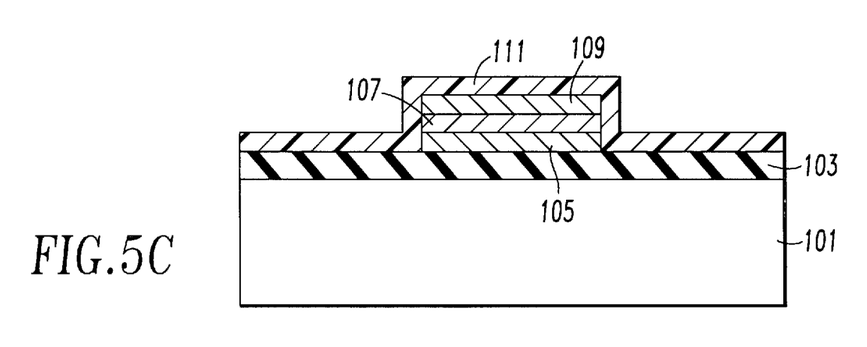
Figure 6:
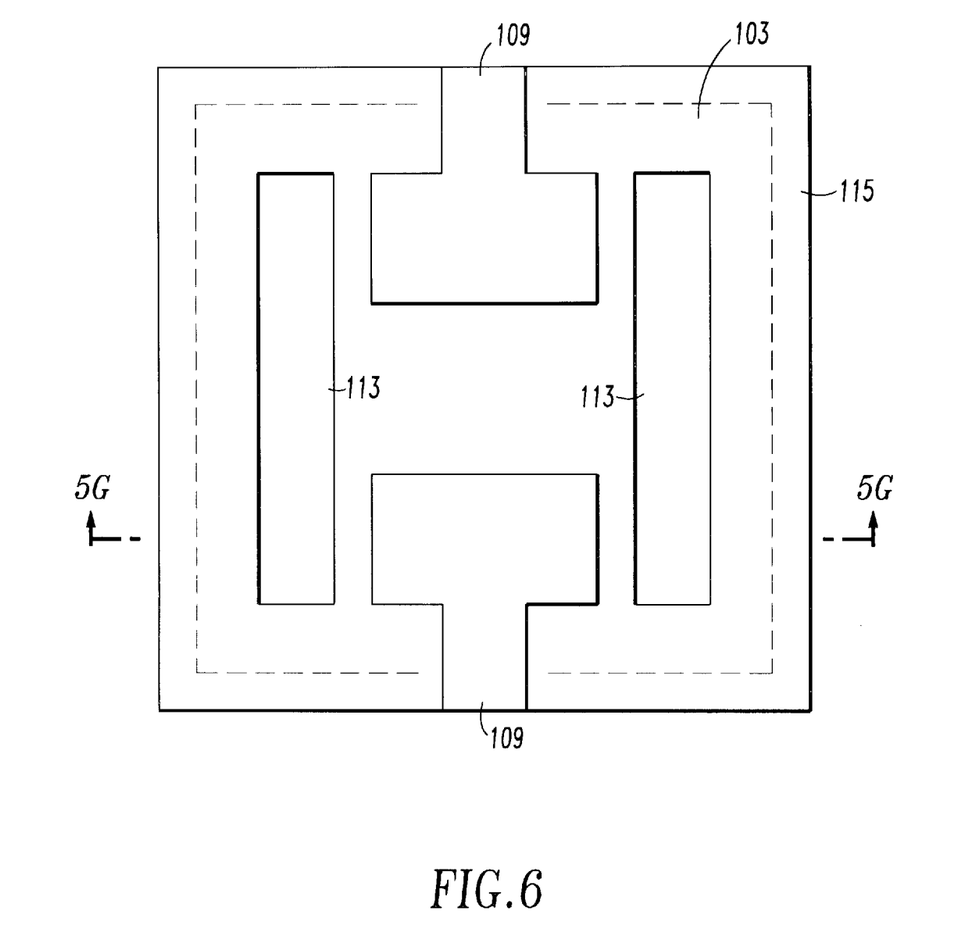
FIG. 6 illustrates a top side view of the FBAR device following the processing of FIG. 5G.

In FIG. 5A, dielectric membrane 103, which may be $SiO_2$ in a preferred embodiment, is deposited upon the entire upper planar surface of substrate 101, which may be silicon. An aluminum plate may be used as a substrate holder. The FBAR is subsequently fabricated onto dielectric membrane 103 as including lower input electrode 105, piezoelectric layer 107 and upper output electrode 109 sequentially deposited on dielectric membrane 103, as illustrated in FIG. 5B. Subsequently, photoresist etch mask 111 is deposited upon the entire upper planar surface of the substrate, including dielectric membrane 103 and the FBAR including lower input electrode 105, piezoelectric layer 107 and upper output electrode 109, as illustrated in FIG. 5C. Although not necessarily limited thereto, photoresist etch mask 111 may be an 8 micron layer of AZ4620 photoresist, descummed, postbaked at 120° C. and deep ultraviolet cured for 30 mins. to produce a photoresist skin to enhance masking ability of the resist.

Figure 5D:
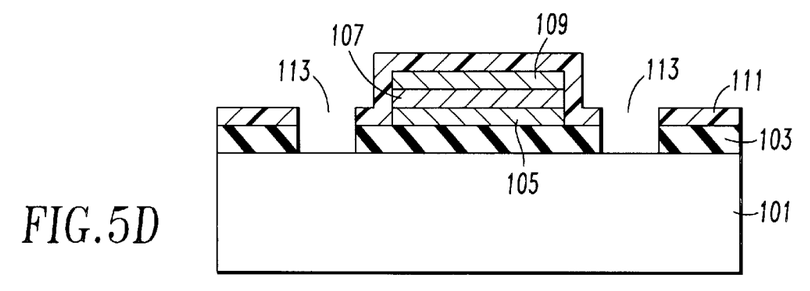

Thereafter, as illustrated in FIG. 5D, respective vias or windows 113 are formed through dielectric membrane 103 and photoresist etch mask 111 to expose substrate 101 near first and second opposite ends of the FBAR. Any typical techniques may be used to remove the layers. In a further preferred embodiment, a ten minute oxide etch ($CHF_3+O_2$) was used to remove any native oxide in the via area of the substrate.

Figure 5E:
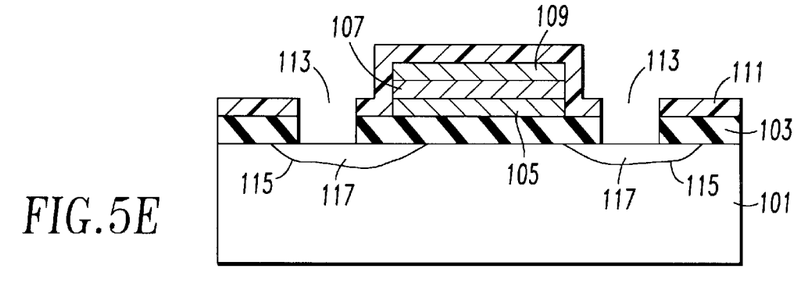
Figure 5F:
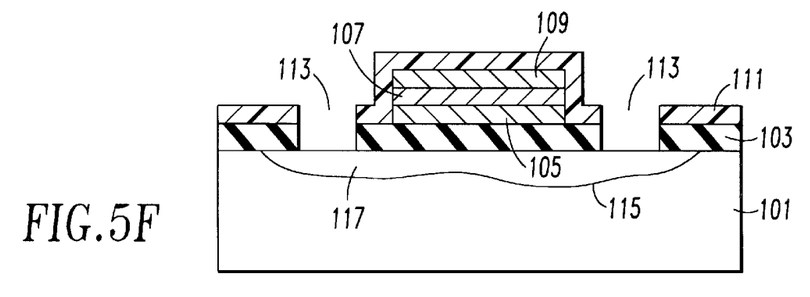

RIE etching is subsequently conducted to etch away substrate 101 near the upper planar surface to form air gaps beneath dielectric membrane 103. In a preferred embodiment, $SF_6$ was used as the reactive gas. The gas pressure during etching was maintained at 200 mTorr. Gas flow was maintained at 55 sccm, RF power at 300W and substrate temperature at 16° C. for an etch time of 125 minutes at an etch rate of 0.8 microns/minutes. In the preferred embodiment, the dry RIE etch was carried out in 30 minute etch segments or intervals each followed by ten minute cool down periods. FIG. 5E depicts air gaps 115 after a first 30 minute etch segment. Since FIGS. 5A–5G illustrate a cross-sectional structural view of a thin-film device taken along a center of air gaps 115, the back wall of air gaps 115 are denoted as 117 in FIGS. 5E–5G. FIG. 5F depicts the device after a second 30 minute etch segment wherein the air gaps have merged into a single air gap 115. In this preferred embodiment, the etching is performed in segments in order to protect photoresist etch mask 111 from polymerizing.

It is to be understood that the air gaps are formed by isotropic etching and that the corresponding shape illustrated is given by way of illustration only. It is to be further understood that dielectric membrane 103 functions as an etch stop. Due to the uniformity of the isotropic etch, the substrate 101 is removed under dielectric membrane 103 such that the ends of the FBAR upon dielectric membrane 103 extend over air gaps 115.

After the etching steps as depicted in FIGS. 5E and 5F, the wafer is run through an ash treatment at 200W and 100° C. for approximately 4½ minutes in an asher to remove any photoresist residue. In an alternative embodiment, the remanent photoresist may be removed by carefully immersing the wafer in acetone followed by gentle air drying. The FBAR having corresponding air gaps 115 formed under dielectric membrane 103 is illustrated in FIG. 5G subsequent photoresist removal.

Figure 5G:
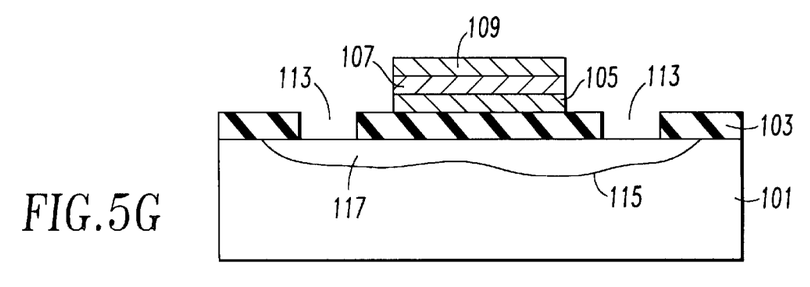

FIG. 6 illustrates a top side view of the device after the processing as described with respect to FIG. 5G is completed. FIG. 5G is a cross-sectional view along the illustrated line. Upper output electrode 109 is illustrated as the uppermost layer of the device. Although not evident in FIG. 6, upper output electrode 109 of the device is formed on piezoelectric layer 107, which is formed on lower input electrode 105. The device is formed on dielectric membrane 103. Also illustrated are windows 113 formed in dielectric membrane 103. The corresponding merged air gap 115 below dielectric membrane 103 is shown by the dotted line.

Dielectric membrane 103 is not necessarily limited as $SiO_2$ deposited upon a silicon substrate. In an alternative embodiment, dielectric membrane 103 may be formed as submembranes or sublayers. For example, dielectric membrane 103 may be formed as a first submembrane of 1 micron thick $SiO_2$ deposited upon the entire upper planar surface of substrate 101 which may be Si and a second submembrane of 0.5 micron thick ZnO deposited on the first submembrane. In a still further alternative embodiment, dielectric membrane 103 may be formed as a first submembrane of 1 micron thick $SiO_2$ deposited upon the entire upper planar surface substrate 101 which may be Si, a second submembrane of 0.1 micron thick CrAu deposited upon the first submembrane and a third submembrane of 1.5 micron thick ZnO deposited upon the second submembrane.

The above-described top-via etch technique provides improved device yield of up to nearly 100%. The process provides uniform air gaps with high reliability and is compatible with other IC processing. The process is not limited to the particular FBAR as depicted in the figures. For example, the process can be used to form dielectric membranes for double-stacked FBARs or other thin film devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a film bulk acoustic resonator comprising the steps of:
   a) depositing a membrane layer on an upper planar surface of a substrate;
   b) forming a film bulk acoustic resonator on the membrane layer;
   c) depositing a photoresist etch mask on the membrane layer and the film bulk acoustic resonator;
   d) opening respective first and second vias through the membrane layer and the photoresist etch mask at respective first and second ends of the film bulk acoustic resonator to expose the substrate;
   e) isotropically etching the substrate through the first and second vias to form air gaps under the membrane layer along the first and second ends of the film bulk acoustic resonator; and
   f) removing the photoresist etch mask.

2. The method of fabricating a film bulk acoustic resonator of claim 1, wherein said step e) comprises etching the substrate using a reactive ion etch.

3. The method of fabricating a film bulk acoustic resonator of claim 2, wherein said step e) comprises etching the substrate in thirty minute etch intervals, each etch interval being followed by a ten minute cool down interval, to obtain air gaps of desired depth.

4. The method of fabricating a film bulk acoustic resonator of claim 3, wherein said step e) further comprises subjecting the etched substrate to an ash treatment.

5. The method of fabricating a film bulk acoustic resonator of claim 2, wherein said step e) comprises using $SF_6$ as reactive gas.

6. The method of fabricating a film bulk acoustic resonator of claim 1, wherein said step b) comprises:
   b1) depositing a first electrode on the membrane layer;
   b2) depositing a piezoelectric layer on the first electrode; and
   b3) depositing a second electrode on the piezoelectric layer.

7. The method of fabricating a film bulk acoustic resonator of claim 6, wherein said step b2) comprises depositing AlN as the piezoelectric layer.

8. The method of fabricating a film bulk acoustic resonator of claim 6, wherein said step b2) comprises depositing ZnO as the piezoelectric layer.

9. The method of fabricating a film bulk acoustic resonator of claim 1, wherein the substrate is Si and said step a) comprises depositing a first submembrane of $SiO_2$ on the upper planar surface of the substrate and a second submembrane of ZnO on the first submembrane as the membrane layer.

10. The method of fabricating a film bulk acoustic resonator of claim 9, wherein the first submembrane is 1 micron thick and the second submembrane is 0.5 micron thick.

11. The method of fabricating a film bulk acoustic resonator of claim 1, wherein the substrate is Si and said step a) comprises depositing a first submembrane of $SiO_2$ on the upper planar surface of the substrate, a second submembrane of CrAu on the first submembrane and a third submembrane of ZnO on the second submembrane as the membrane layer.

12. The method of fabricating a film bulk acoustic resonator of claim 11, wherein the first submembrane is 1 micron thick, the second submembrane is 0.1 micron thick and the third submembrane is 1.5 microns thick.

13. The method of fabricating a film bulk acoustic resonator of claim 1, wherein the substrate is Si and said step a) comprises depositing $SiO_2$ as the membrane layer.

14. A method of forming air gaps under a dielectric membrane, the dielectric membrane being deposited on an upper planar surface of a substrate and having a thin film device integrated thereon, the method comprising the steps of:
   a) depositing a photoresist layer on the dielectric membrane and the thin film device;
   b) forming respective first and second vias through the dielectric membrane and the photoresist layer at respective first and second ends of the thin film device to expose the substrate;
   c) isotropically etching the substrate through the first and second vias to form air gaps under the dielectric membrane along the first and second ends of the thin film device; and
   d) removing the photoresist layer.

15. The method of forming air gaps under a dielectric membrane of claim 14, wherein the thin film device is a film bulk acoustic resonator.

16. The method of forming air gaps under a dielectric membrane of claim 14, wherein the substrate is Si and the dielectric membrane is deposited as a first submembrane of $SiO_2$ on the upper planar surface of the substrate and a second submembrane of ZnO on the first submembrane.

17. The method of forming air gaps under a dielectric membrane of claim 14, wherein the substrate is Si and the dielectric membrane is deposited as a first submembrane of $SiO_2$ on the upper planar surface of the substrate, a second submembrane of CrAu on the first submembrane and a third submembrane of ZnO on the second submembrane.

18. The method of forming air gaps under a dielectric membrane of claim 14, wherein the substrate is Si and the dielectric membrane is deposited on the upper planar surface of the substrate as an $SiO_2$ dielectric membrane.

19. The method of forming air gaps under a dielectric membrane of claim 14, wherein said step c) comprises etching the substrate using a reactive ion etch.

20. The method of forming air gaps under a dielectric membrane of claim 14, wherein said step c) comprises etching the substrate in thirty minute etch intervals, each etch interval being followed by a ten minute cool down interval, to obtain air gaps of desired depth.

21. The method of forming air gaps under a dielectric membrane of claim 14, wherein said step a) comprises forming a protective skin of photoresist material having enhanced masking ability on the dielectric membrane and the thin film device.

* * * * *